(12) United States Patent
Wang et al.

(10) Patent No.: US 7,262,104 B1
(45) Date of Patent: Aug. 28, 2007

(54) SELECTIVE CHANNEL IMPLANTATION FOR FORMING SEMICONDUCTOR DEVICES WITH DIFFERENT THRESHOLD VOLTAGES

(75) Inventors: Haihong Wang, Milpitas, CA (US); Shibly S. Ahmed, San Jose, CA (US); Bin Yu, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 54 days.

(21) Appl. No.: 10/857,931

(22) Filed: Jun. 2, 2004

(51) Int. Cl.
*H01L 21/336* (2006.01)

(52) U.S. Cl. .................. 438/289; 438/300; 257/E29.13

(58) Field of Classification Search ........ 438/287–308, 438/268–274; 257/E29.13
See application file for complete search history.

(56) References Cited

U.S. PATENT DOCUMENTS

| | | | |
|---|---|---|---|
| 4,319,395 A | 3/1982 | Lund et al. ................ 29/571 |
| 4,399,605 A | 8/1983 | Dash et al. ................ 29/571 |
| 5,942,786 A * | 8/1999 | Sheu et al. ................ 257/390 |
| 6,171,910 B1 * | 1/2001 | Hobbs et al. .............. 438/275 |
| 6,319,781 B1 * | 11/2001 | Lee et al. ................... 438/275 |
| 6,391,750 B1 | 5/2002 | Chen et al. ................ 438/583 |
| 6,451,693 B1 | 9/2002 | Woo et al. ................. 438/682 |
| 6,589,836 B1 | 7/2003 | Wang et al. ............... 438/231 |
| 6,657,259 B2 | 12/2003 | Fried et al. ................ 257/350 |
| 6,677,204 B2 * | 1/2004 | Cleeves et al. ............ 438/268 |
| 6,800,905 B2 | 10/2004 | Fried et al. |
| 6,803,631 B2 | 10/2004 | Dakshina-Murthy et al. |
| 6,846,734 B2 | 1/2005 | Amos et al. ................ 438/592 |
| 2001/0045589 A1 | 11/2001 | Takeda et al. ............. 257/297 |
| 2002/0088971 A1 | 7/2002 | Tezuka et al. .............. 257/19 |
| 2004/0038464 A1 | 2/2004 | Fried et al. ................ 438/151 |
| 2004/0048424 A1 | 3/2004 | Wu et al. ................... 438/154 |
| 2004/0063286 A1 * | 4/2004 | Kim et al. ................. 438/283 |
| 2004/0195628 A1 | 10/2004 | Wu et al. ................... 257/351 |

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.
Yang-Kyu Choi et al., "Sub-20nm CMOS FinFET Technologies," 2001 IEEE, IEDM, pp. 421-424.
Xuejue Huang et al., "Sub-50 nm P-Channel FinFET," IEEE Transactions on Electron Devices, vol. 48, No. 5, May 2001, pp. 880-886.
Xuejue Huang et al., "Sub 50-nm FinFET: PMOS," 1999 IEEE, IEDM, pp. 67-70.
Yang-Kyu Choi et al., "Nanoscale CMOS Spacer FinFET for the Terabit Era," IEEE Electron Device Letters, vol. 23, No. 1, Jan. 2002, pp. 25-27.
Co-pending U.S. Appl. No. 10/614,001; by Shibly S. Ahmend et al; filed Jul. 8, 2003; 20 page specification, 8 sheets of drawings.
Co-pending U.S. Appl. No. 10/674,520; by Haihong Wang et al.; filed Oct. 1, 2003; 16 page specification; 19 sheets of drawings.

* cited by examiner

*Primary Examiner*—H. Jey Tsai
(74) *Attorney, Agent, or Firm*—Harrity Snyder, LLP

(57) ABSTRACT

Multiple semiconductor devices are formed with different threshold voltages. According to one exemplary implementation, first and second semiconductor devices are formed and doped differently, resulting in different threshold voltages for the first and second semiconductor devices.

18 Claims, 20 Drawing Sheets

US 7,262,104 B1

SELECTIVE CHANNEL IMPLANTATION FOR FORMING SEMICONDUCTOR DEVICES WITH DIFFERENT THRESHOLD VOLTAGES

FIELD OF THE INVENTION

Systems and methods consistent with the principles of the invention relate generally to semiconductor devices and, more particularly, to semiconductor devices formed with different threshold voltages.

BACKGROUND OF THE INVENTION

Scaling of device dimensions has been a primary factor driving improvements in integrated circuit performance and reduction in integrated circuit cost. Due to limitations associated with gate-oxide thicknesses and source/drain (S/D) junction depths, scaling of existing bulk semiconductor devices below the 0.1 μm process generation may be difficult, if not impossible. New device structures and new materials, thus, are likely to be needed to improve semiconductor performance.

Double-gate metal-oxide semiconductor field-effect transistors (MOSFETs) represent devices that are candidates for succeeding existing planar MOSFETs. In double-gate MOSFETs, the use of two gates to control the channel significantly suppresses short-channel effects. A FinFET is a double-gate structure that includes a channel formed in a vertical fin. Although a double-gate structure, the FinFET is similar to existing planar MOSFETs in layout and fabrication techniques. The FinFET also provides a range of channel lengths, CMOS compatibility, and large packing density compared to other double-gate structures.

SUMMARY OF THE INVENTION

Implementations consistent with the principles of the invention provide selective channel implantation methods for forming FinFET devices that have multiple threshold voltages.

In one aspect consistent with the principles of the invention, a method for forming at least first and second semiconductor devices with different threshold voltages is provided. The method may include depositing gate material on the first and second semiconductor devices, selectively removing the gate material from the first semiconductor device, performing an implantation process on the first and second semiconductor devices, and selectively removing the gate material from the second semiconductor device, where threshold voltages associated with the first and second semiconductor devices are different.

According to another aspect, a method for forming at least first and second semiconductor devices with different threshold voltages is provided. The method may include performing a first implantation process on the first and second semiconductor devices, selectively covering the first semiconductor device, and performing a second implantation process on the selectively covered first semiconductor device and the second semiconductor device. The method may also include removing the covering from the selectively covered first semiconductor device and annealing the first and second semiconductor devices, where threshold voltages associated with the annealed first semiconductor device and the annealed second semiconductor device are different.

According to yet another aspect, a semiconductor device includes a first FinFET device with a first threshold voltage and a second FinFET device with a second threshold voltage, whether the first and second threshold voltages are different.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention perform selective channel implantation to form FinFET devices that have different threshold voltages ($V_t$'s). The FinFET devices may be used to optimize circuit performance, such as leakage and drivability for different circuit paths.

Exemplary Devices with Different Threshold Voltages

Figure 1:
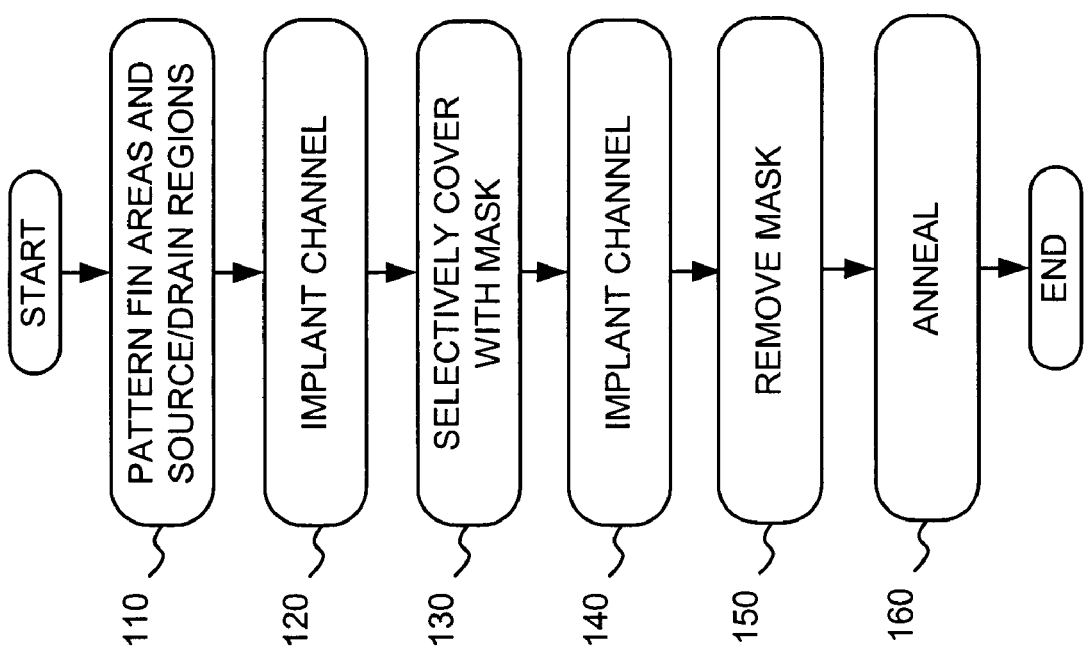
FIG. 1 illustrates an exemplary process for fabricating semiconductor devices (e.g., FinFET devices) in accordance with an implementation consistent with the principles of the invention.

FIG. 1 illustrates an exemplary process for fabricating semiconductor devices (e.g., FinFET devices) in accordance with an implementation consistent with the principles of the invention. FIGS. 2-7 illustrate exemplary views of semiconductor devices fabricated according to the processing described with regard to FIG. 1.

Figure 2:
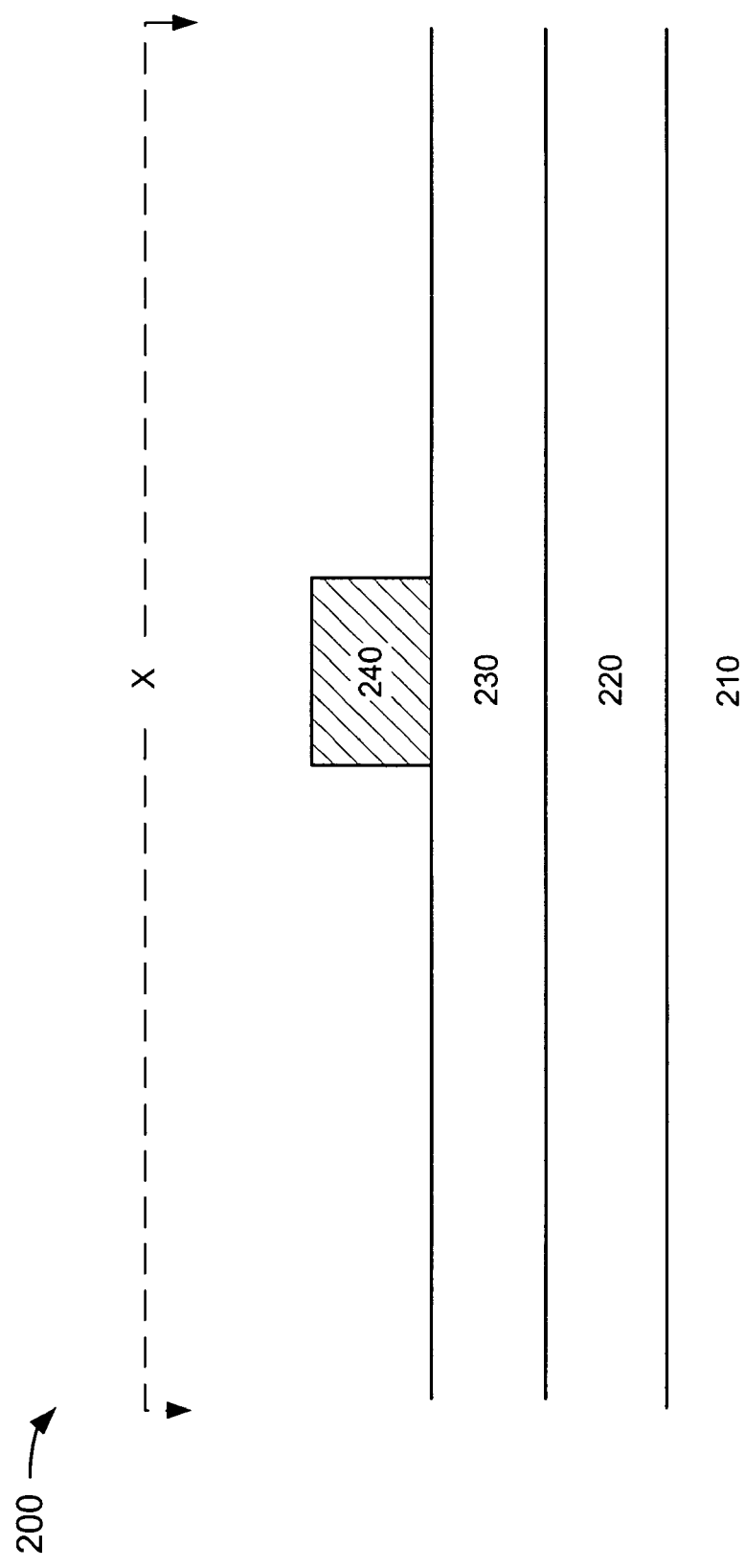
FIGS. 2-7 illustrate exemplary views of semiconductor devices fabricated according to the processing described in FIG. 1.

With reference to FIGS. 1 and 2, processing may begin with formation of a semiconductor device 200. One or more other semiconductor devices, such as semiconductor device 200' (described below), may be formed on the same wafer (or portion of a wafer, chip, etc.), possibly in parallel with semiconductor device 200, using the process described herein.

Referring to FIG. 2, semiconductor device 200 may include a silicon-on-insulator (SOI) structure that includes a silicon substrate 210, a buried oxide layer 220, and a silicon layer 230 formed on buried oxide layer 220. Buried oxide layer 220 and silicon layer 230 may be formed on substrate 210 in a conventional manner.

In an exemplary implementation, buried oxide layer 220 may include a silicon oxide and may have a thickness ranging from about 100 Å to about 500 Å. Silicon layer 230 may include monocrystalline or polycrystalline silicon having a thickness ranging from about 200 Å to about 1000 Å. Silicon layer 230 may be used to form a fin structure, as described in more detail below.

In alternative implementations consistent with the present invention, substrate 210 and layer 230 may include other semiconducting materials, such as germanium, or combinations of semiconducting materials, such as silicon-germanium. Buried oxide layer 220 may also include other dielectric materials.

A photoresist material (or another type of masking material) may be deposited and patterned to form a photoresist mask 240 for subsequent processing. The photoresist material may be deposited and patterned in any conventional manner.

Semiconductor device 200 may then be etched to form a fin area and source and drain regions (act 110). In an exemplary implementation, silicon layer 230 may be etched in a conventional manner, with the etching terminating on buried oxide layer 220 to form a fin. Photoresist mask 240 may then be removed using a conventional technique. After the formation of the fin, source and drain regions may be formed (e.g., by deposition or epitaxial growth of a semiconducting material) adjacent the respective ends of the fin. For example, in an exemplary embodiment, a layer of silicon, germanium, or a combination of silicon and germanium may be deposited, patterned and etched in a conventional manner to form source and drain regions. Alternately, the source and drain regions may be formed in the same photolithography process that forms the fin.

Figure 3:
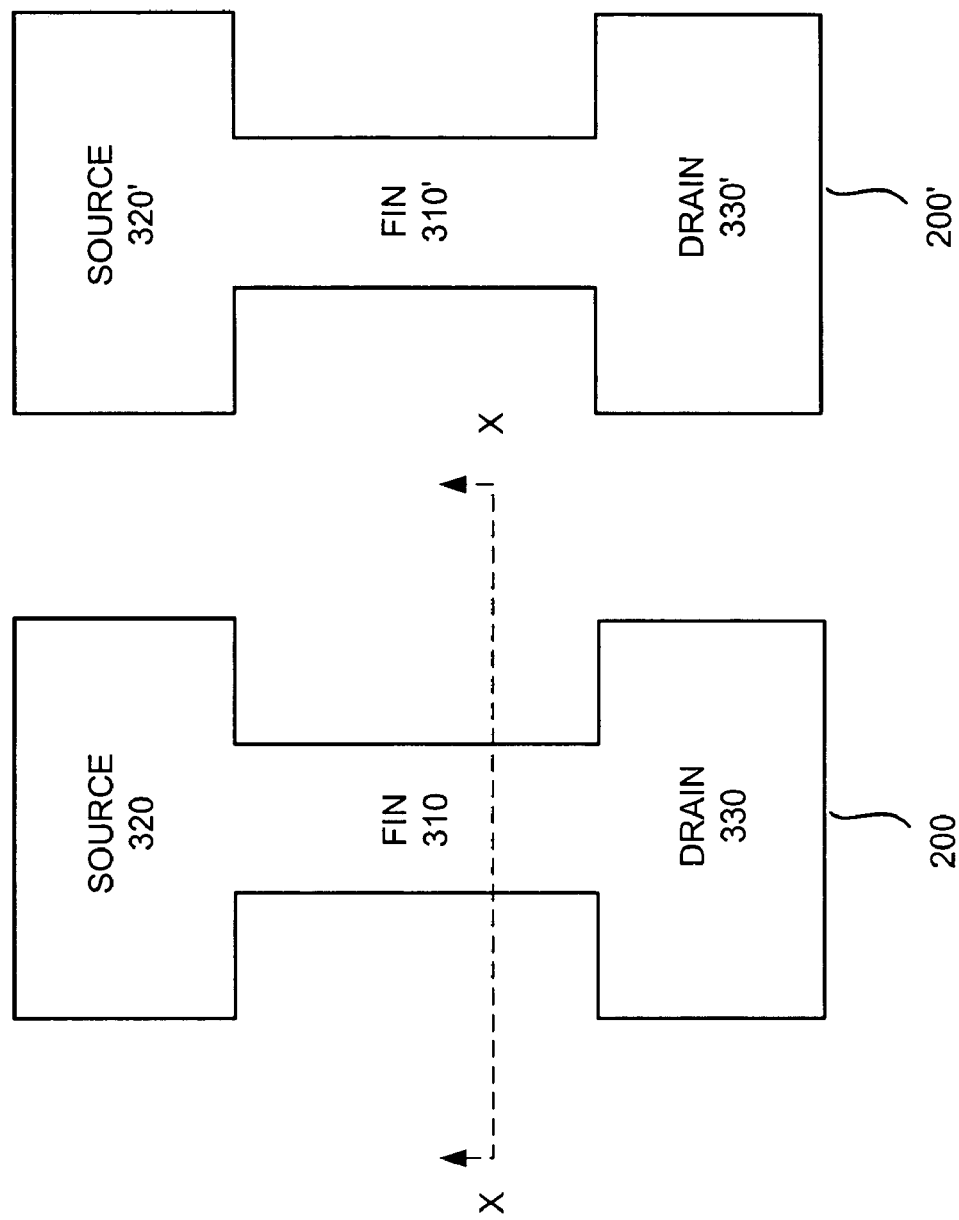

FIG. 3 schematically illustrates a top view of semiconductor device 200 and semiconductor device 200' that may both be formed as described above. Although devices 200 and 200' may be connected to other devices, or interconnected, these connections are not illustrated in FIG. 3 for clarity of presentation. Also, while two devices are shown in FIG. 3, additional devices may also be included in other implementations consistent with the principles of the invention.

Semiconductor device 200 may include fin area 310, source region 320, and drain region 330. Fin 310 may have a width ranging from about 50 Å to about 1000 Å in a channel region of semiconductor device 200 and a thickness (i.e., height) ranging from about 100 Å to 1000 Å. Semiconductor device 200' may similarly include fin area 310', source region 320', and drain region 330'. Fin 310' may have a similar width and thickness as fin 310. Source regions 320/320' and drain regions 330/330' may be formed adjacent the ends of fin areas 310/310' on buried oxide layer 220, according to an exemplary implementation of the present invention.

Figure 4:
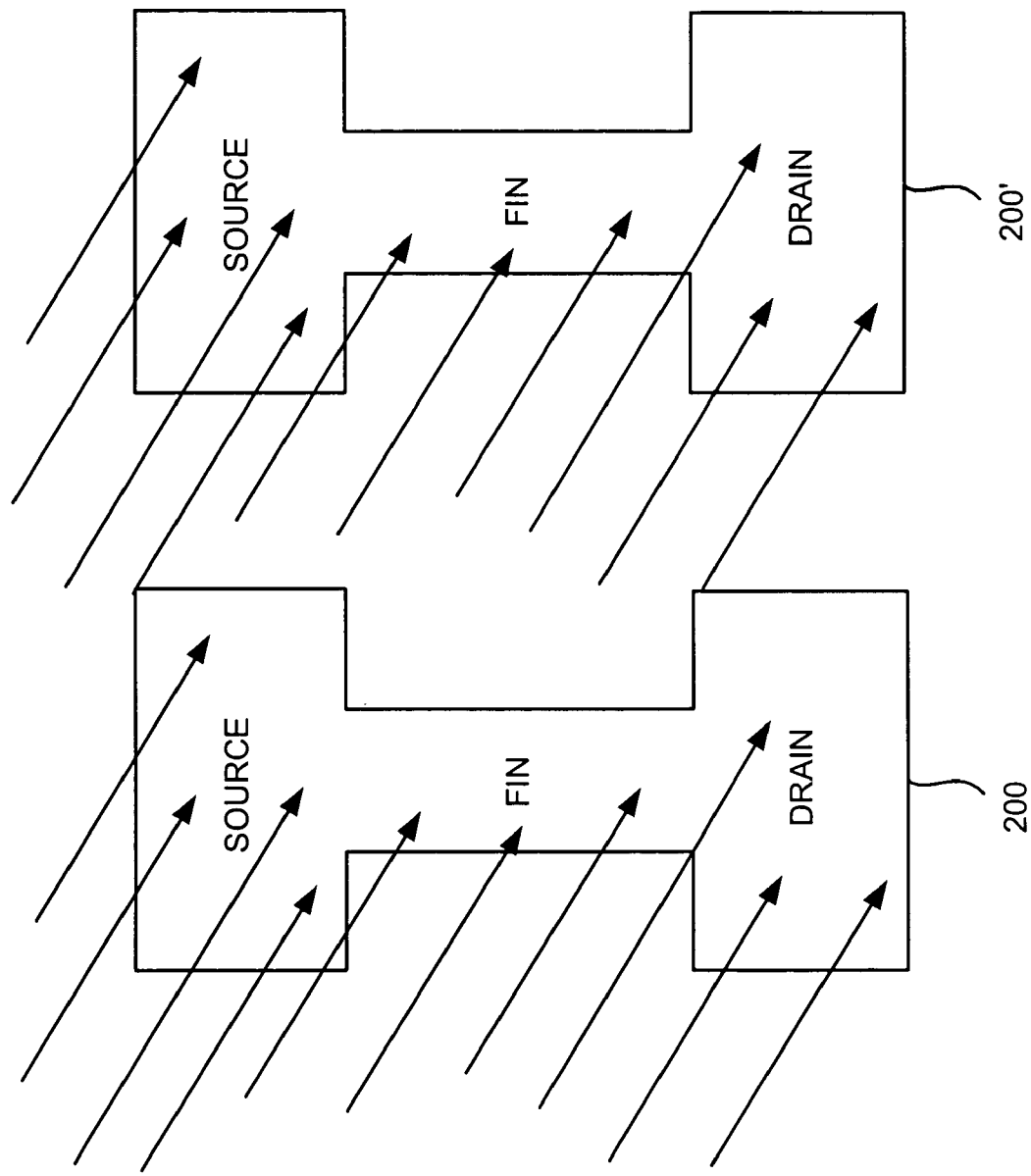

Semiconductor devices 200 and 200' may then be partially doped via a first channel implantation process (act 120), as illustrated in FIG. 4. For example, n-type or p-type impurities may be implanted in semiconductor devices 200 and 200'. The particular implantation dosages and energies may be selected based on the particular end device requirements. For example, the impurities may be implanted at a dosage of about $10^{15}$ atoms/cm$^2$ to about $10^{16}$ atoms/cm$^2$ and an implantation energy of about 10 KeV to about 50 KeV. After the implantation process is complete, semiconductor devices 200 and 200' may include silicon partially doped with n-type or p-type impurities.

Figure 5:
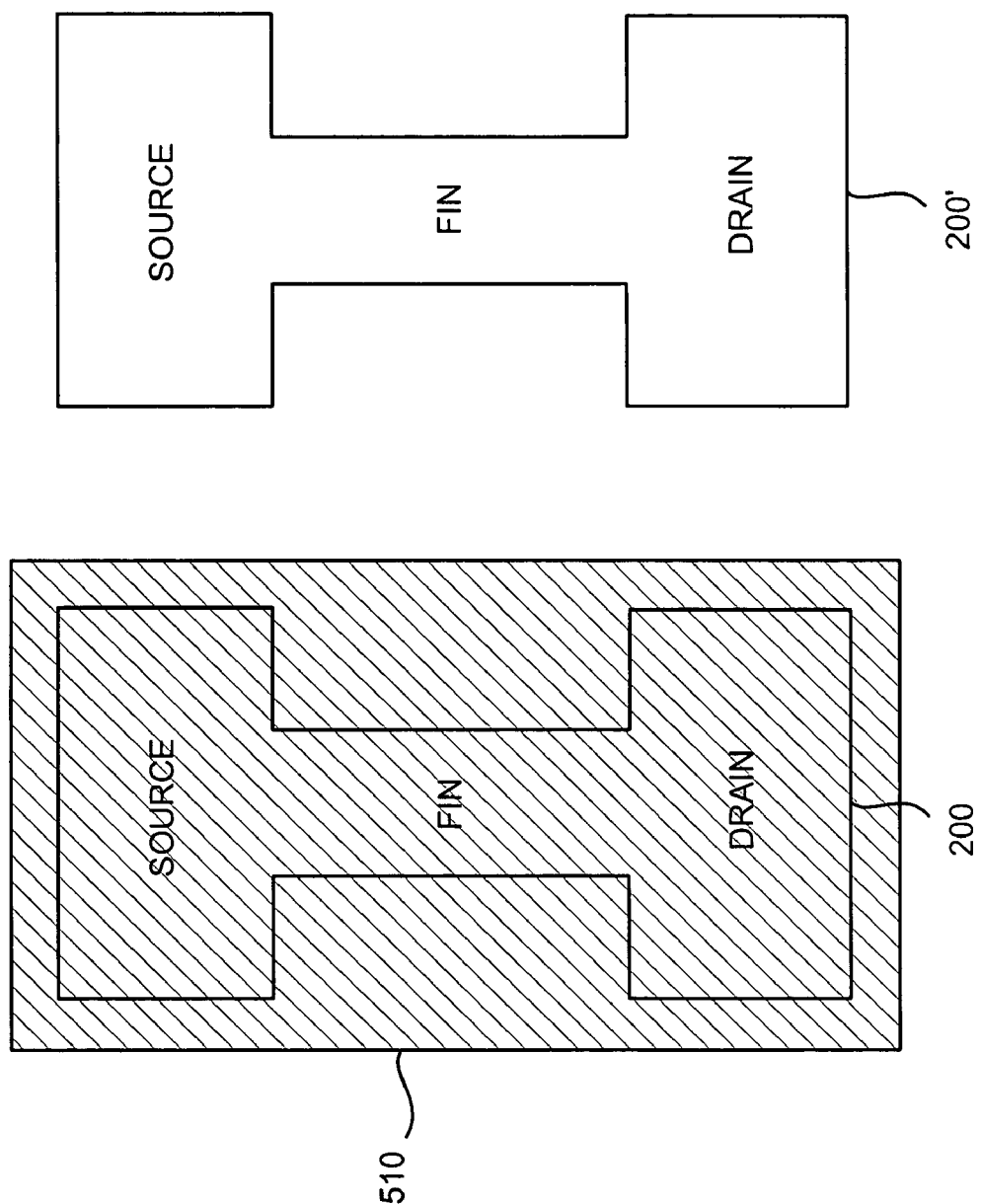

A photoresist material (or another type of masking material) may be selectively deposited and patterned to form a photoresist mask 510 that covers semiconductor device 200 (act 130), as illustrated in FIG. 5. The photoresist material may be deposited to a thickness to adequately shield semiconductor device 200 during a subsequent implantation (e.g., about 500 Å to about 2000 Å). The photoresist material may then be patterned in any conventional manner. In an alternate implementation, photoresist mask 510 may be formed to cover semiconductor device 200', instead of semiconductor device 200.

Figure 6:
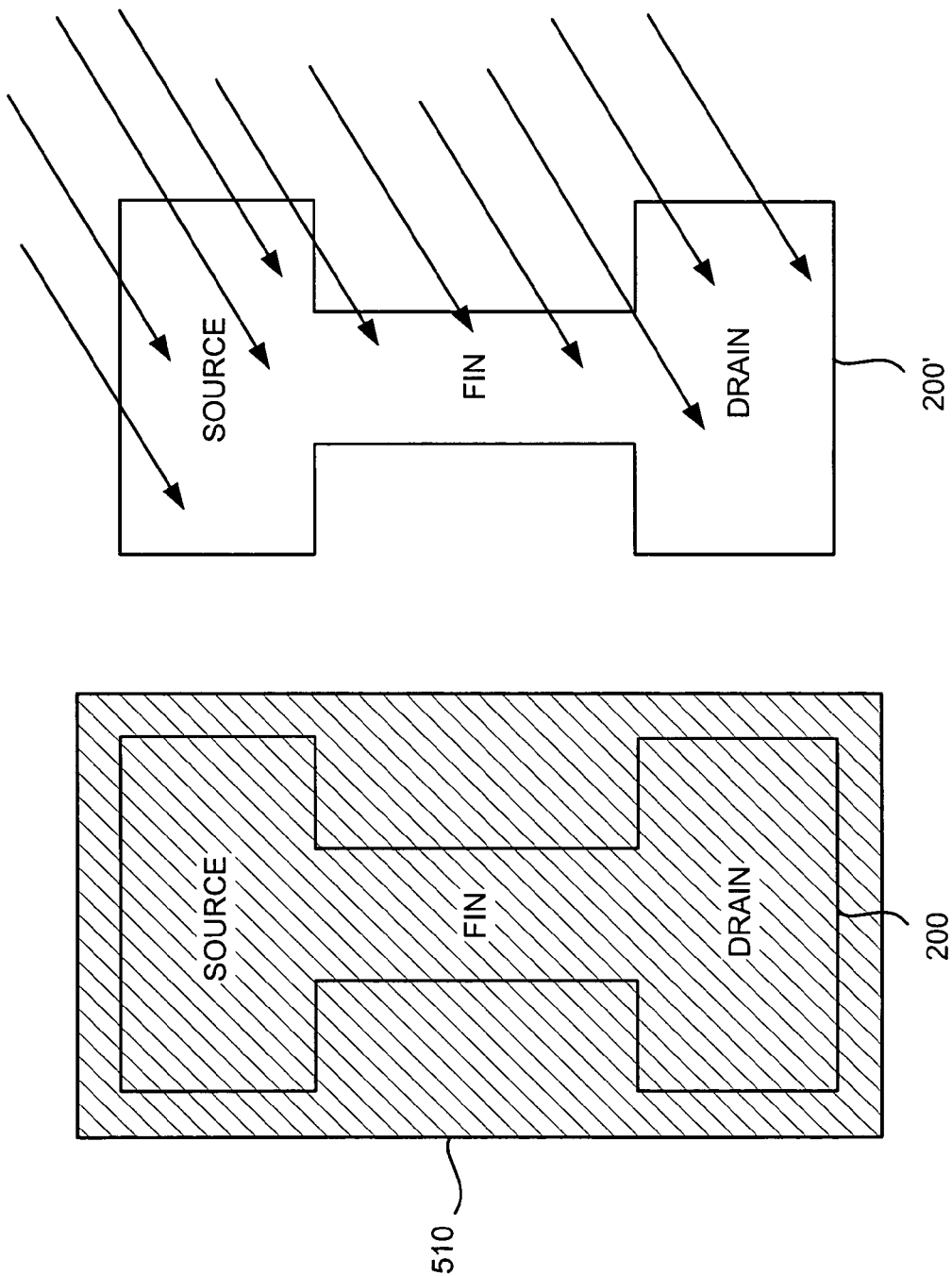

Semiconductor device 200' may then be further doped via a second channel implantation process (act 140), as illustrated in FIG. 6. For example, n-type or p-type impurities, whichever were implanted previously, may be implanted in semiconductor device 200'. The particular implantation dosages and energies may be selected based on the particular end device requirements. For example, the impurities may be implanted at a dosage of about $10^{15}$ atoms/cm$^2$ to about $10^{16}$ atoms/cm$^2$ and an implantation energy of about 10 KeV to about 50 KeV.

Because semiconductor device 200 is covered by photoresist mask 510, semiconductor device 200 is not affected by the second channel implanting process. After the implantation process is complete, semiconductor device 200' may include silicon doped with impurities to a greater degree than semiconductor device 200.

Figure 7:
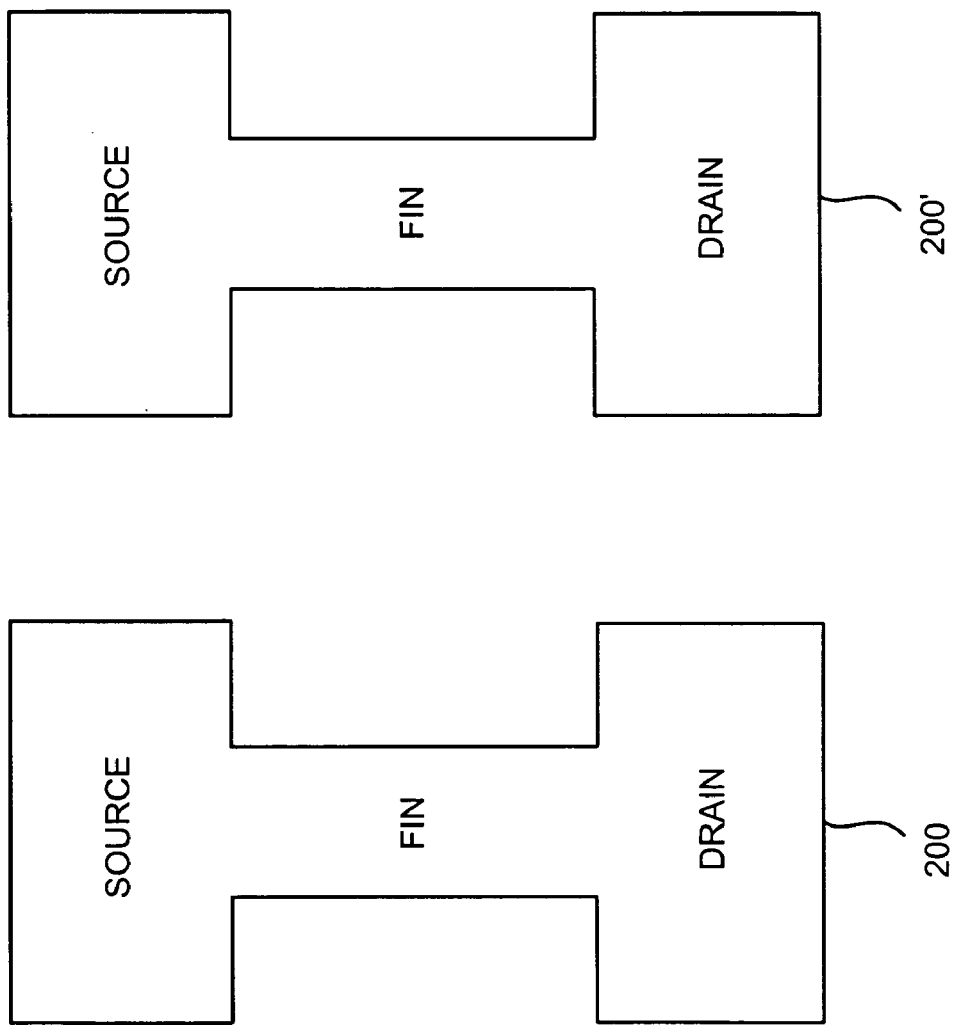

Photoresist mask 510 may be removed using a conventional technique (act 150), as illustrated in FIG. 7. A conventional annealing process may then be performed on semiconductor devices 200 and 200' (act 160). Because semiconductor device 200' has been more fully doped, semiconductor device 200' may have a different threshold voltage ($V_t$) than semiconductor device 200, which was only partially doped. In one implementation consistent with the principles of the invention, the second channel implantation process may reduce the $V_t$ of semiconductor device 200' by about 0.1 V to about 0.5 V, relative to semiconductor device 200, which was subjected to only the first channel implantation process. One or more gates (not shown) may be subsequently formed over semiconductor devices 200/200'.

Those skilled in the art will understand, in view of the disclosure herein, that different devices (e.g., devices 200 and 200') may be formed with different $V_t$'s for a variety of design reasons. For example, the $V_t$ may be varied based on the type of device 200/200'. In one implementation consistent with the principles of the invention, N-type MOS (NMOS) devices may be formed with a $V_t$ larger in magnitude (i.e., absolute value) than the $V_t$ of P-type MOS (PMOS) devices on the same wafer/chip. Alternately, PMOS devices may be formed with a $V_t$ larger in magnitude than the $V_t$ of NMOS devices on the same wafer/chip.

It may also be advantageous to vary $V_t$ within a given circuit element (e.g., inverter, NAND gate, memory element, NOR gate, etc.). Within a single circuit element, for example, one FinFET device may have a first threshold voltage $V_{t1}$. Another FinFET device within the same circuit element may have a second, different threshold voltage $V_{t2}$.

Alternately, or additionally, $V_t$ may be varied between circuit elements. For example, one circuit element may include one or more FinFET devices having associated first threshold voltages $V_{t1}$. A separate circuit element may include one or more FinFET devices having associated second, different threshold voltages $V_{t2}$.

Thus, in accordance with the present invention, different FinFET devices 200/200' may be differentially doped. Semiconductor devices 200/200' may be formed on the same wafer or chip and may exhibit different threshold voltages $V_t$'s. Advantageously, the resulting structure exhibits good short channel behavior. In addition, the present invention provides increased flexibility and can be easily integrated into conventional processing.

Figure 8:
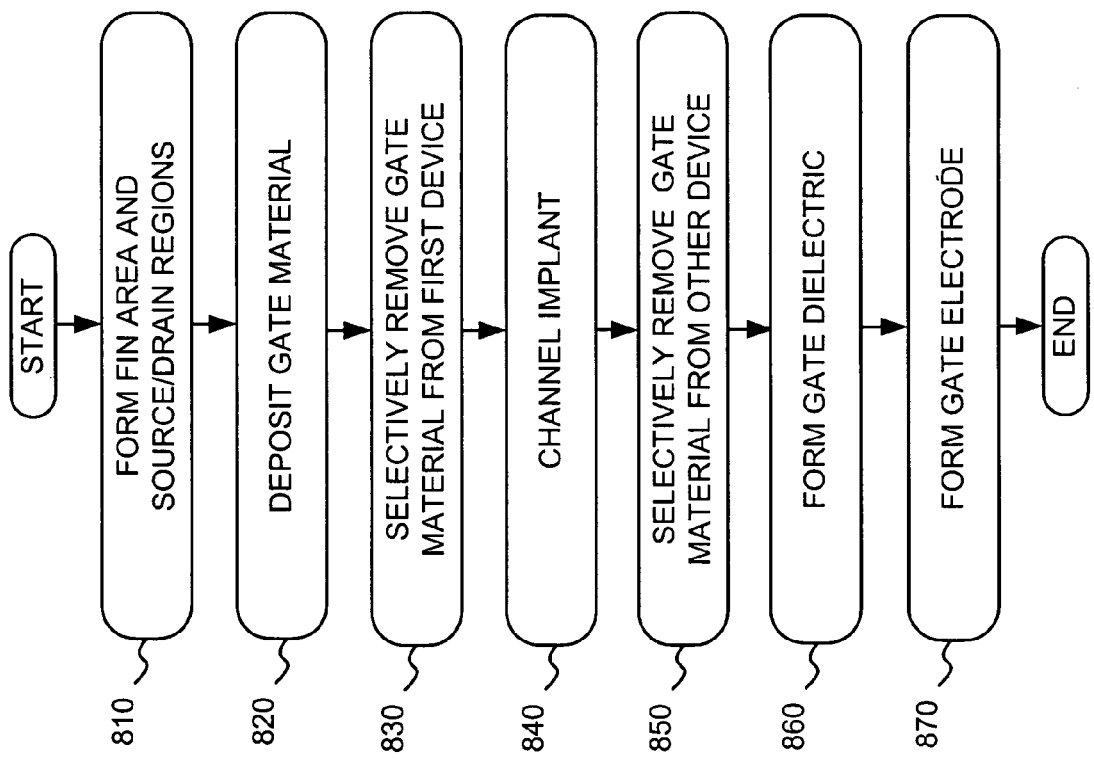
FIG. 8 illustrates an exemplary process for fabricating semiconductor devices (e.g., damascene FinFET devices) in accordance with another implementation consistent with the principles of the invention.

FIG. 8 illustrates an exemplary process for fabricating semiconductor devices (e.g., damascene FinFET devices) in accordance with an implementation consistent with the principles of the invention. FIGS. 9-15 illustrate exemplary views of semiconductor devices fabricated according to the processing described with regard to FIG. 8.

Figure 9:
FIGS. 9-15 illustrate exemplary views of semiconductor devices fabricated according to the processing described in FIG. 8.

With reference to FIGS. 8 and 9, processing may begin with formation of a semiconductor device 900. One or more other semiconductor devices, such as semiconductor device 900' (described below), may be formed on the same wafer (or portion of a wafer, chip, etc.), possibly in parallel with semiconductor device 900, using the process described herein.

Referring to FIG. 9, semiconductor device 900 may include a silicon-on-insulator (SOI) structure that includes a silicon substrate 910, a buried oxide layer 920, and a silicon layer 930 formed on buried oxide layer 920. Buried oxide layer 920 and silicon layer 930 may be formed on substrate 910 in a conventional manner.

In an exemplary implementation, buried oxide layer 920 may include a silicon oxide and may have a thickness ranging from about 300 Å to about 2000 Å. Silicon layer 930 may have a thickness ranging from about 100 Å to about 1000 Å.

In alternative implementations consistent with the present invention, substrate 910 and layer 930 may include other semiconducting materials, such as germanium, or combinations of semiconducting materials, such as silicon-germanium. Buried oxide layer 920 may also include other dielectric materials.

Figure 10:
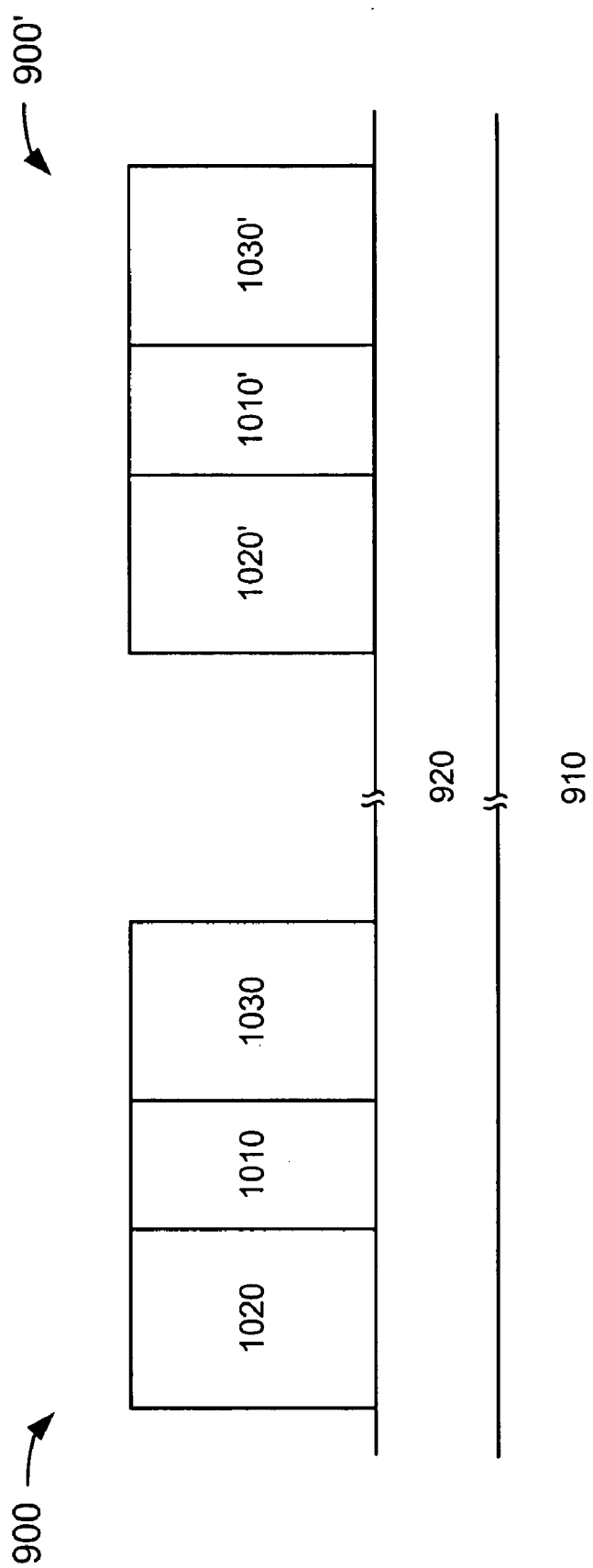

FIG. 10 is an exemplary diagram of semiconductor device 900 and semiconductor device 900' that may be formed, as described above. Although devices 900 and 900' may be connected to other devices, or interconnected, these connections are not illustrated in FIG. 10 for clarity of presentation. Also, while two devices are shown in FIG. 10, additional devices may also be included in other implementations consistent with the principles of the invention.

As illustrated in FIG. 10, silicon layer 930 may be etched to form one or more fin areas 1010/1010' for FinFET devices in a manner similar to that described above with regard to FIGS. 2 and 3 (act 810). Silicon layer 930 may also be used to form source regions 1020/1020' and drain regions 1030/1030' adjacent fin areas 1010/1010', similar to that described above with regard to FIG. 3 (act 810).

Figure 11:
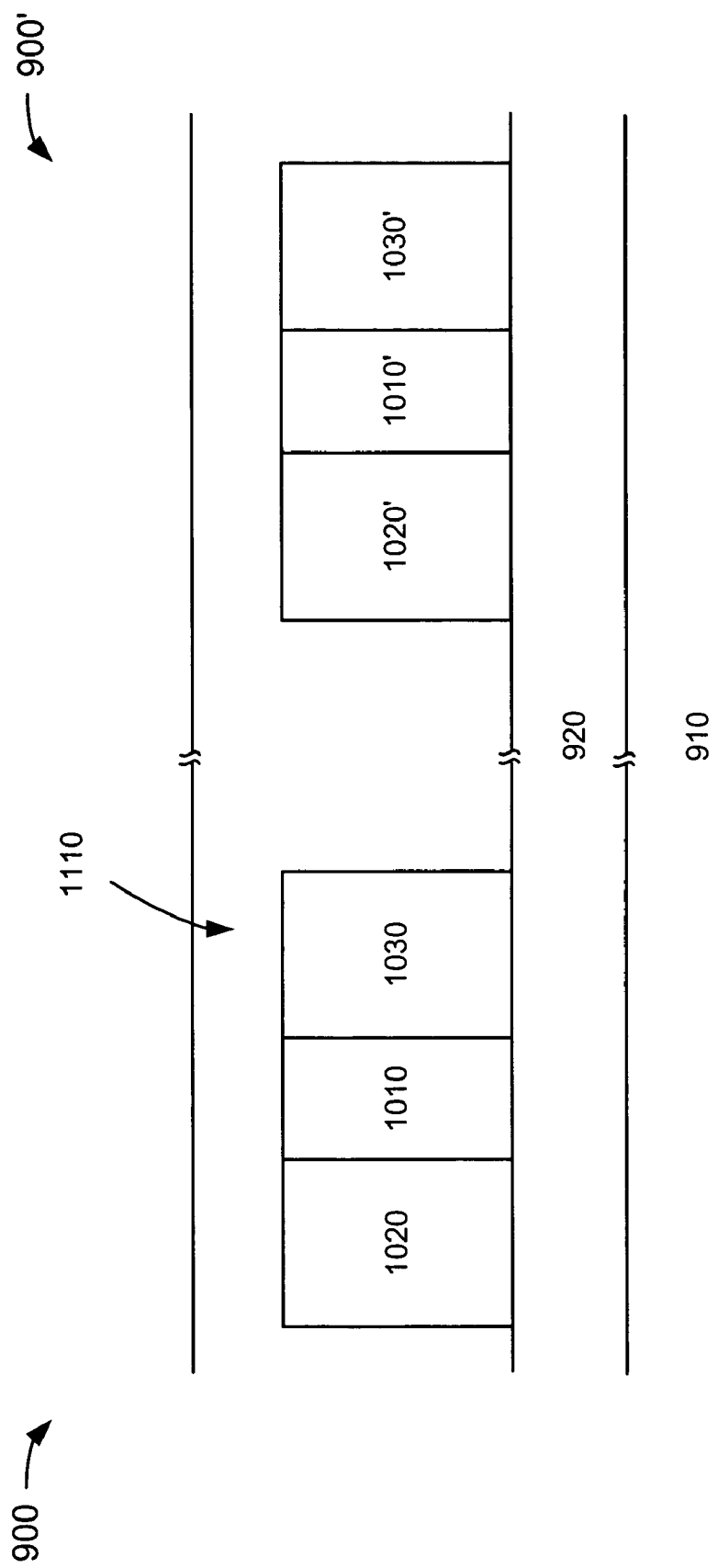

A gate material 1110 may be deposited over semiconductor devices 900/900' (act 820), as illustrated in FIG. 11. Gate material 1110 may include a conventional gate material, such as polysilicon. Gate material 1110 may be deposited to a thickness ranging from about 100 Å to about 1000 Å, as measured from the top of fin areas 1010/1010' in FIG. 11.

Gate material 1110 may then be selectively removed from semiconductor device 900 or 900' (act 830). In the example shown in FIG. 12, gate material 1110 is selectively removed from semiconductor device 900. In other implementations, gate material 1110 may alternatively be selectively removed from semiconductor device 900'.

Figure 12:
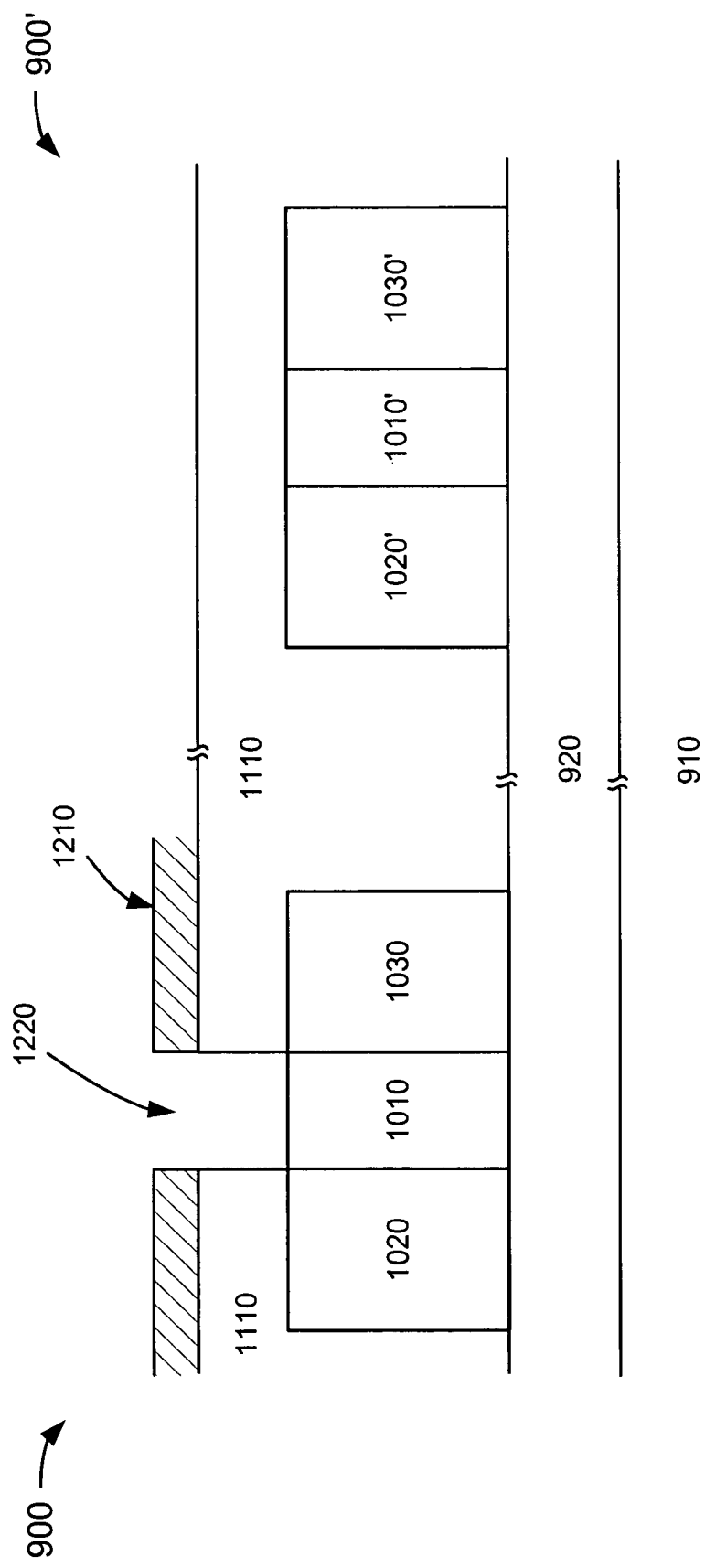

To facilitate selective removal of gate material 1110, a photoresist material (or another type of masking material) may be deposited and patterned to form a photoresist mask 1210 covering a portion of semiconductor device 900, as illustrated in FIG. 12. The photoresist material may be deposited to a thickness ranging from about 500 Å to about 2000 Å. The photoresist material may then be patterned in any conventional manner. While the photoresist material is shown in FIG. 12 as covering only semiconductor device 900, the photoresist material may also be deposited to cover semiconductor device 900'.

Semiconductor device 900 may then be etched to form a gate trench 1220, as illustrated in FIG. 12. In an exemplary implementation, gate material 1110 may be etched in a conventional manner, with the etching terminating on fin area 1010 to form gate trench 1220. The resulting gate trench 1220 may have a width of approximately 100 Å to 1000 Å. Photoresist mask 1210 may then be removed using a conventional technique.

Figure 13:
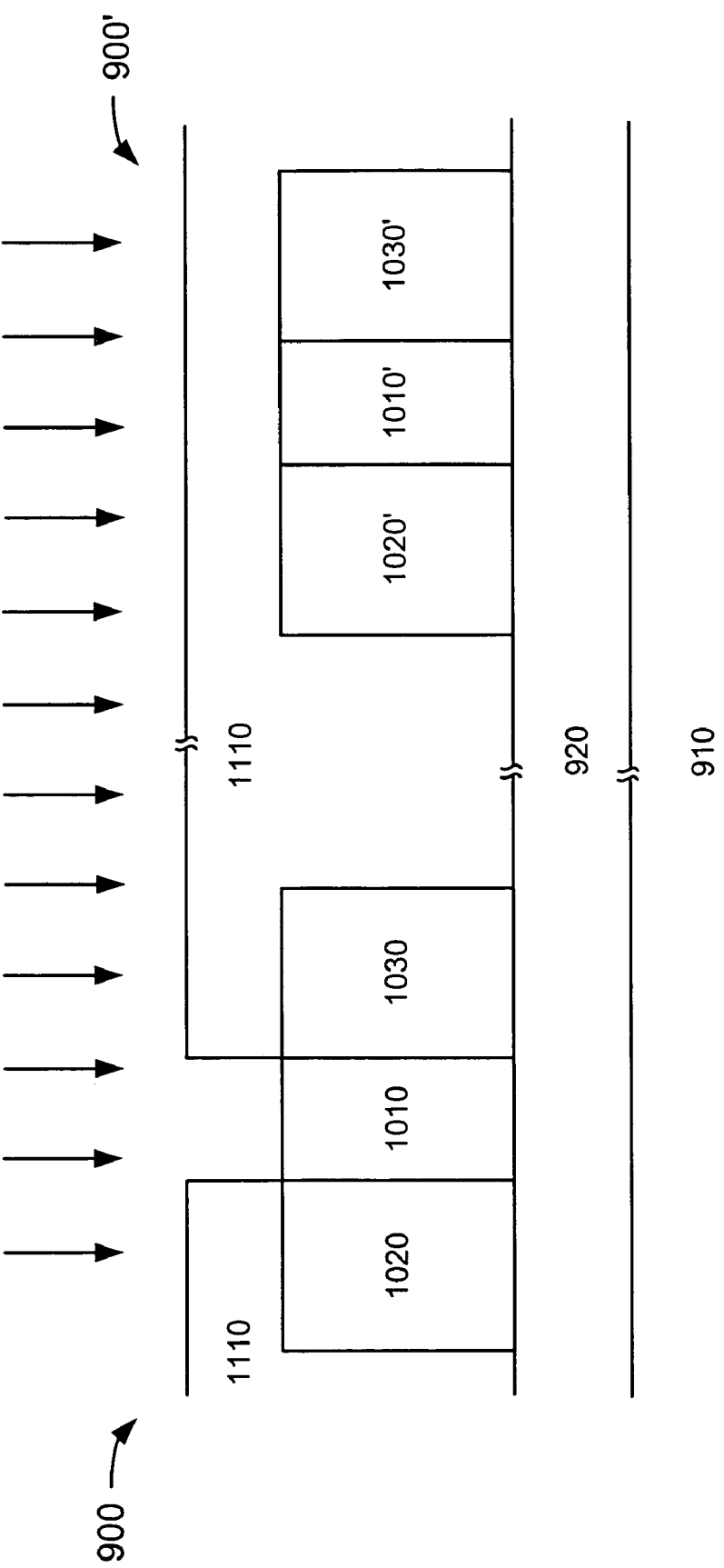

Semiconductor devices 900 and 900' may then be doped via a channel implantation process (act 840), as illustrated in FIG. 13. For example, n-type or p-type impurities may be implanted in semiconductor devices 900 and 900'. The particular implantation dosages and energies may be selected based on the particular end device requirements. For example, the impurities may be implanted at a dosage of about $10^{15}$ atoms/cm$^2$ to about $10^{16}$ atoms/cm$^2$ and an implantation energy of about 10 KeV to about 50 KeV. After the implantation process is complete, fin area 1010 may be doped with n-type or p-type impurities.

Figure 14:
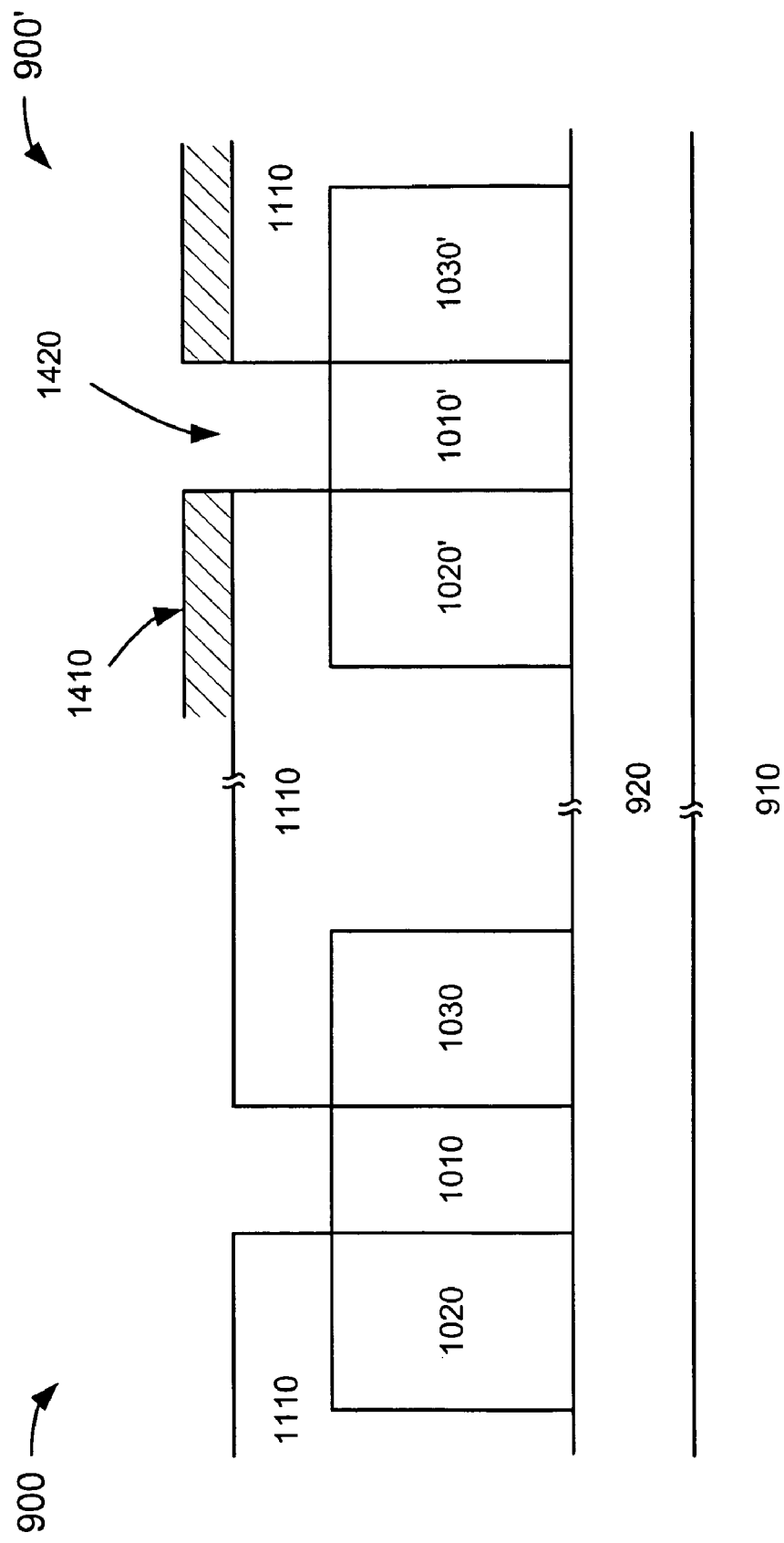

Gate material 1110 may then be selectively removed from semiconductor device 900' (act 850), as illustrated in FIG. 14. To facilitate selective removal of gate material 1110 from semiconductor device 900', a photoresist material (or another type of masking material) may be deposited and patterned to form a photoresist mask 1410 covering a portion of semiconductor device 900', as illustrated in FIG. 14. The photoresist material may be deposited to a thickness ranging from about 500 Å to about 2000 Å. The photoresist material may then be patterned in any conventional manner. While the photoresist material is shown in FIG. 14 as covering only semiconductor device 900', the photoresist material may also be deposited to cover semiconductor device 900.

Semiconductor device 900' may be etched to form a gate trench 1420, as illustrated in FIG. 14. In an exemplary implementation, gate material 1110 may be etched in a conventional manner, with the etching terminating on fin area 1010' to form gate trench 1420. The resulting gate trench 1420 may have a width of approximately 100 Å to 1000 Å. Photoresist mask 1410 may then be removed using a conventional technique.

Figure 15:
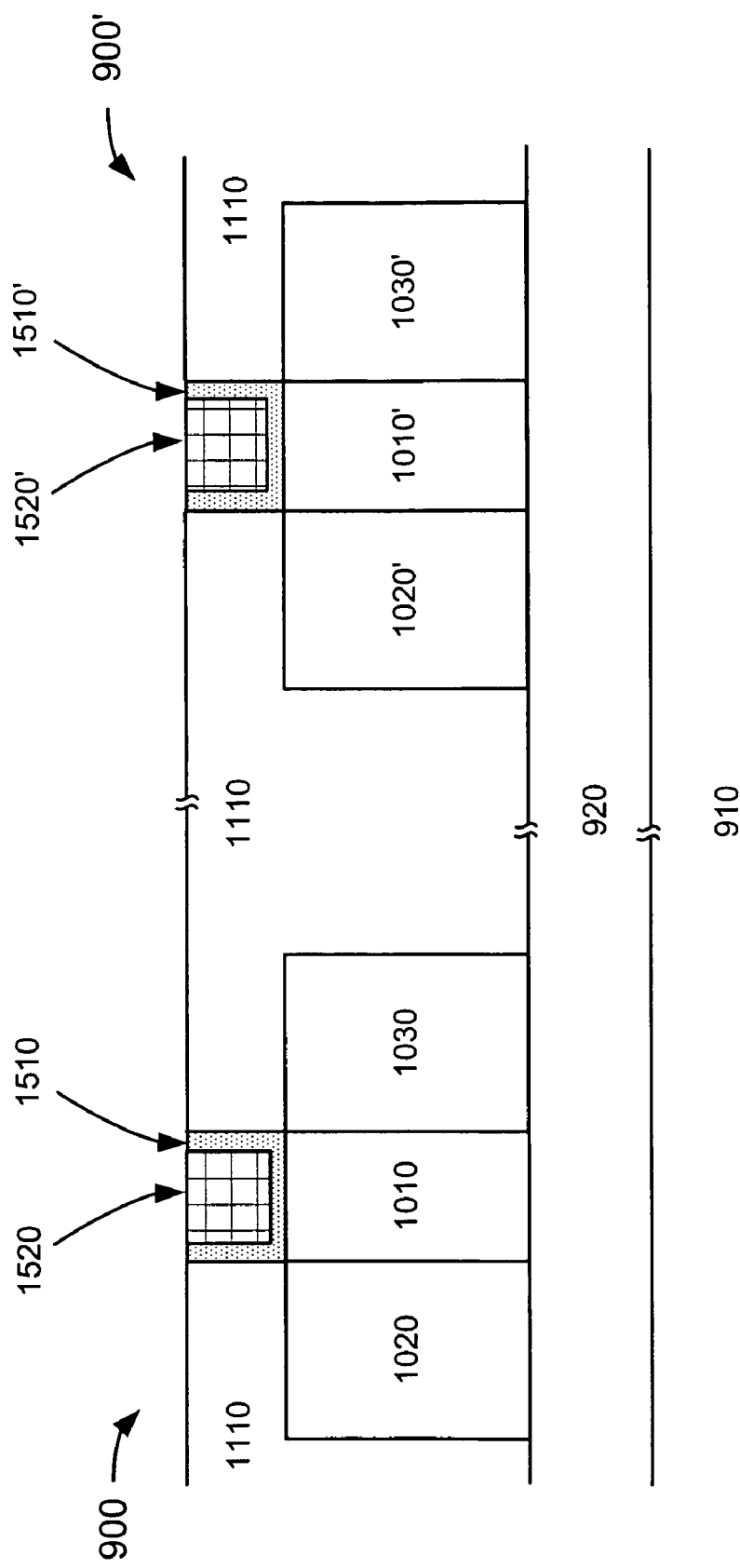

A gate dielectric material 1510/1510' may be deposited or thermally grown on the side surfaces of gate trench 1220/1420 (act 860), as illustrated in FIG. 15. Gate dielectric material 1510/1510' may be formed at a thickness ranging from approximately 10 Å to 50 Å. Gate dielectric material 1510/1510' may include conventional dielectric materials, such as an oxide (e.g., silicon dioxide). In other implementations, a nitride material, such as a silicon nitride, may be used as the gate dielectric material.

A gate electrode material 1520/1520' may be deposited to at least partially fill gate trench 1220/1420 (act 870). Gate electrode material 1520/1520' may be formed at a thickness ranging from approximately 10 Å to 50 Å. A number of conductive materials may be used for gate electrode material 1520/1520'. For example, gate electrode material 1520/1520' may include a metal (e.g., tungsten, tantalum, aluminum, nickel, ruthenium, rhodium, palladium, platinum, titanium, molybdenum, etc.), a metal containing compound (e.g., titanium nitride, tantalum nitride, ruthenium oxide, etc.), or a doped semiconductor material (e.g., polycrystalline silicon, polycrystalline silicon-germanium, etc.). If necessary, chemical-mechanical polishing (CMP) or another comparable technique may be performed to remove excess gate electrode material (e.g., above gate material 1110).

Because the channel of semiconductor device 900 has been doped but the channel of semiconductor device 900' has not, semiconductor device 900 may have a different threshold voltage $V_t$ than semiconductor device 900'. In one implementation consistent with the principles of the invention, the channel implantation process may reduce the threshold voltage $V_t$ of semiconductor device 900 by about 0.1 V to about 0.5 V, relative to semiconductor device 900', which was not subjected to the channel implantation process.

Those skilled in the art will understand, in view of the disclosure herein, that different devices (e.g., devices 900 and 900') may be formed with different $V_t$'s for a variety of design reasons. For example, the threshold voltage $V_t$ may be varied based on the type of device 900/900'. In one implementation consistent with the principles of the invention, NMOS devices may be formed with a $V_t$ larger in magnitude (i.e., absolute value) than the $V_t$ of PMOS devices on the same wafer/chip. Alternately, PMOS devices may be formed with a $V_t$ larger in magnitude than the $V_t$ of NMOS devices on the same wafer/chip.

It may also be advantageous to vary $V_t$ within a given circuit element (e.g., inverter, NAND gate, memory element, NOR gate, etc.). Within a single circuit element, for example, one FinFET device may have a first threshold voltage $V_{t1}$. Another FinFET device within the same circuit element may have a second, different threshold voltage $V_{t2}$.

Alternately, or additionally, $V_t$ may be varied between circuit elements. For example, one circuit element may include one or more FinFET devices having associated first threshold voltages $V_{t1}$. A separate circuit element may include one or more FinFET devices having associated second, different threshold voltages $V_{t2}$.

Thus, in accordance with the present invention, different damascene FinFET devices 900/900' may be differentially doped. The resulting semiconductor devices 900/900' may be formed on the same wafer or chip and may exhibit different threshold voltages $V_t$. Advantageously, the resulting structure exhibits good short channel behavior. In addition, the present invention provides increased flexibility and can be easily integrated into conventional processing.

Another Implementation

Figure 16:
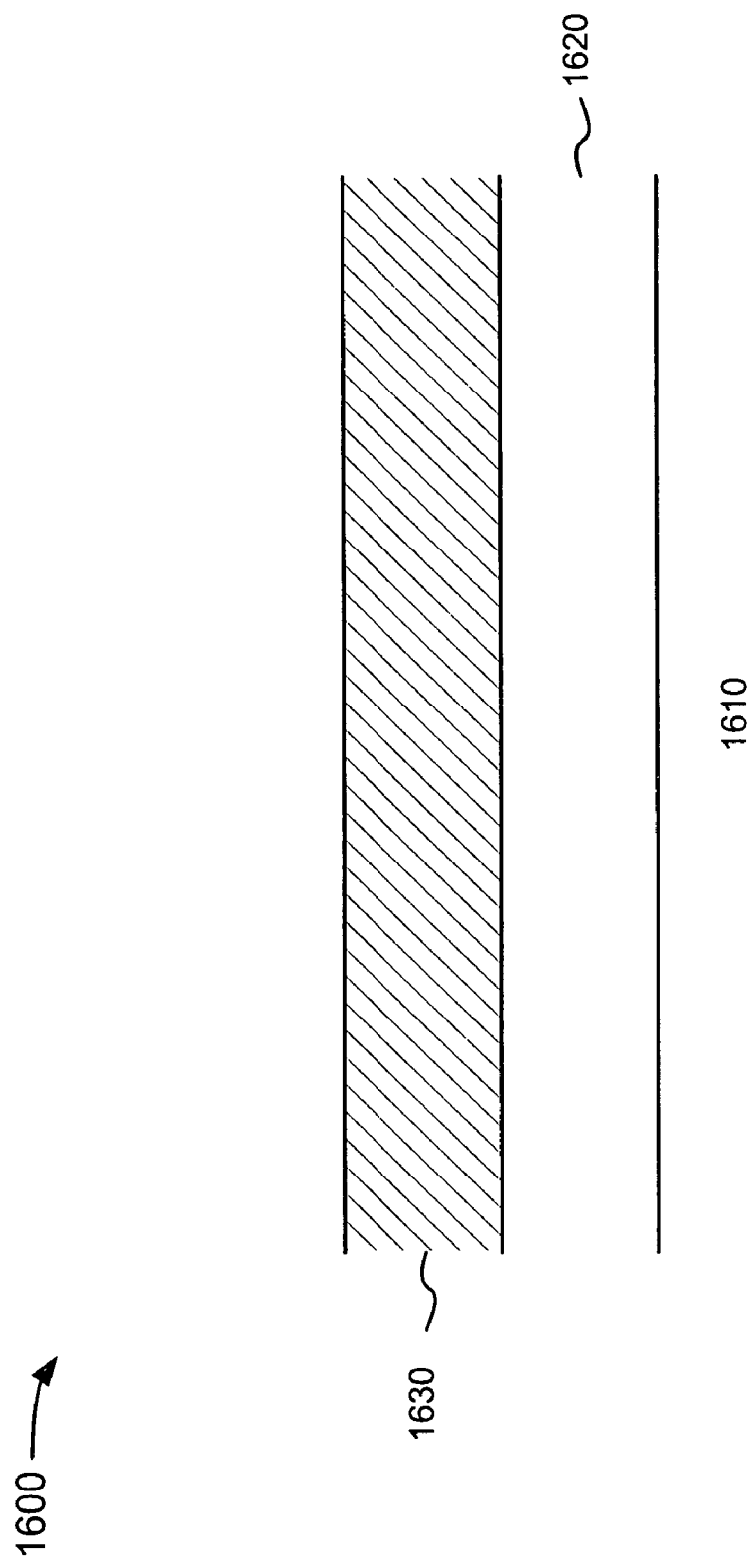
FIGS. 16-20 illustrate exemplary views of semiconductor devices fabricated according to an alternate implementation consistent with the principles of the invention.

According to yet another implementation, different $V_t$ FinFETs may be achieved through a tilt angle process. With reference to FIG. 16, processing may begin with semiconductor device 1600. Semiconductor device 1600 may include a SOI structure that includes a buried oxide layer on a silicon substrate (collectively shown in FIG. 16 as substrate 1610) and a silicon layer 1620 formed on the buried oxide layer. It will be appreciated that silicon layer 1620 may be used to form one or more fins.

In alternative implementations, substrate 1610 and layer 1620 may include other semiconductor materials, such as germanium, or combinations of semiconductor materials, such as silicon-germanium. The buried oxide layer may include a silicon oxide or other types of dielectric materials.

A thick cap layer 1630 (or hard mask) may be formed on top of silicon layer 1620 to aid in pattern optimization and protect silicon layer 1620 during subsequent processing. Cap layer 1630 may, for example, include a silicon nitride material or some other type of material capable of protecting silicon layer 1620 during the fabrication process. Cap layer 1630 may be deposited, for example, by chemical vapor deposition (CVD).

Figure 17:
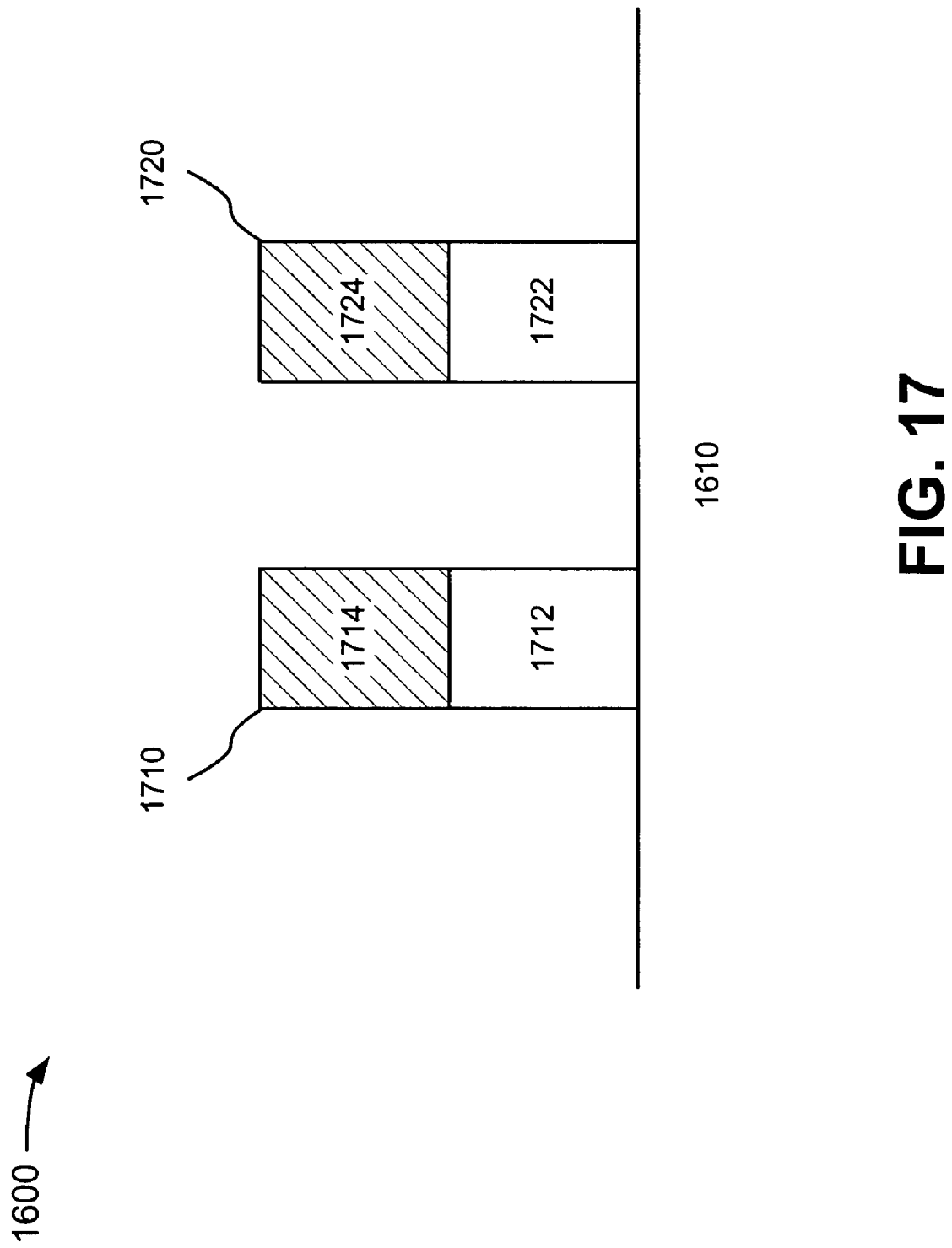

Silicon layer 1620 may be patterned by conventional lithographic techniques (e.g., optical or electron beam lithography). Silicon layer 1620 may then be etched using well-known etching techniques to form multiple fin structures 1710 and 1720, as illustrated in FIG. 17. As shown in FIG. 17, fin structure 1710/1720 includes a fin 1712/1722 and a cap 1714/1724. Cap 1714/1724 may remain covering fin 1712/1714.

Figure 18:
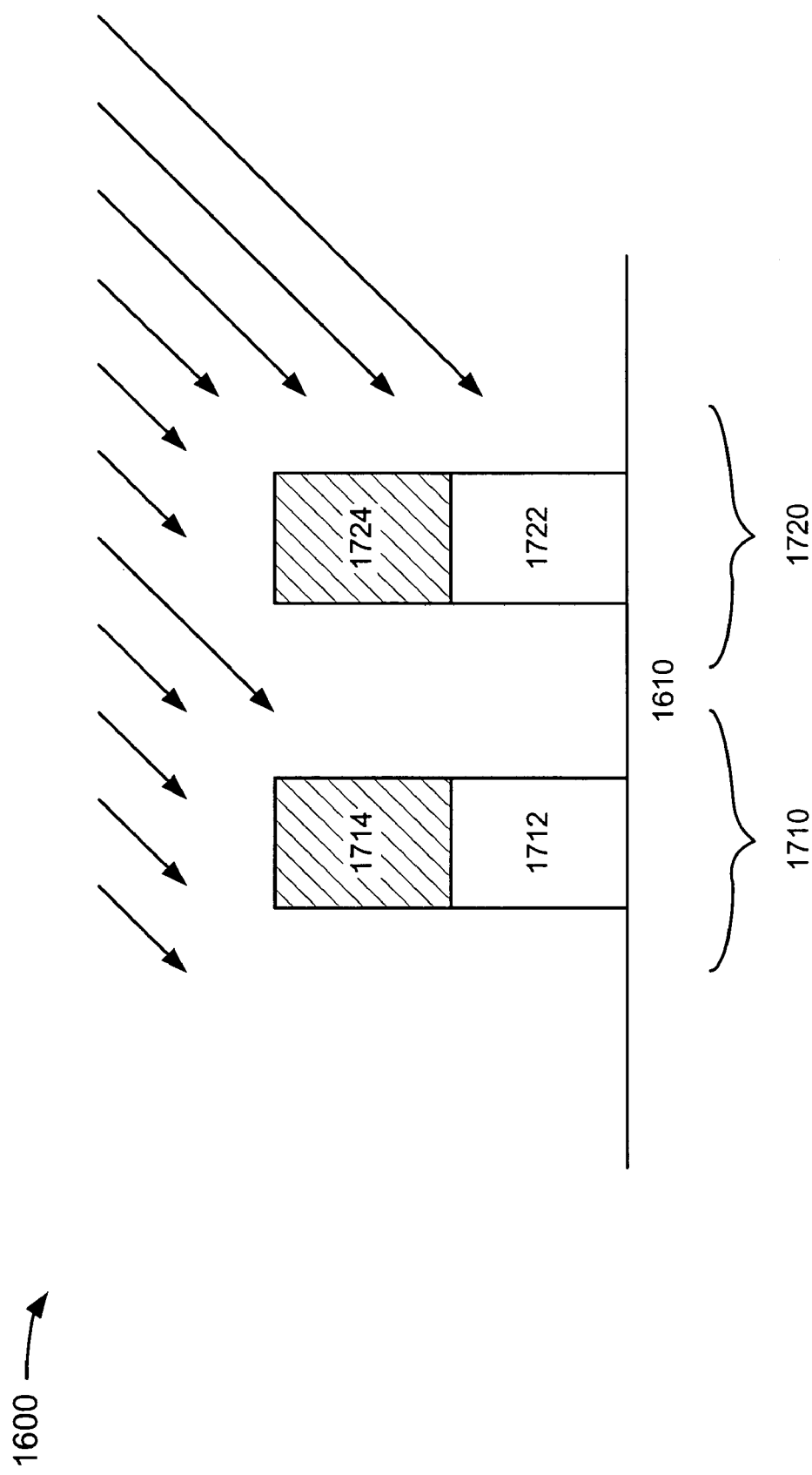

Following the formation of fin structures 1710 and 1720, conventional tilt angle implantation processes may be performed to dope fins 1712 and 1722. For example, a conventional implantation process of n-type or p-type impurities may be performed to dope fin 1722, as illustrated in FIG. 18. The particular angle used for the implantation process may be dependent upon the height of cap 1714/1724. For example, if the height of cap 1714/1724 is approximately equal to the height of fin 1712/1722, then the angle used may be less than or equal to 45 degrees. The impurities may be implanted at a dosage and an implantation energy based on the thickness of fin 1722 and the particular circuit requirements.

The implanting of the impurities does not dope fin 1712. There are several factors that aid in preventing the impurities from reaching fin 1712. For example, the presence, height, and closeness of fin structure 1720 shields or shadows fin 1712, thereby blocking the impurities from reaching fin 1712. The height of cap 1714 also helps block the impurities.

Figure 19:
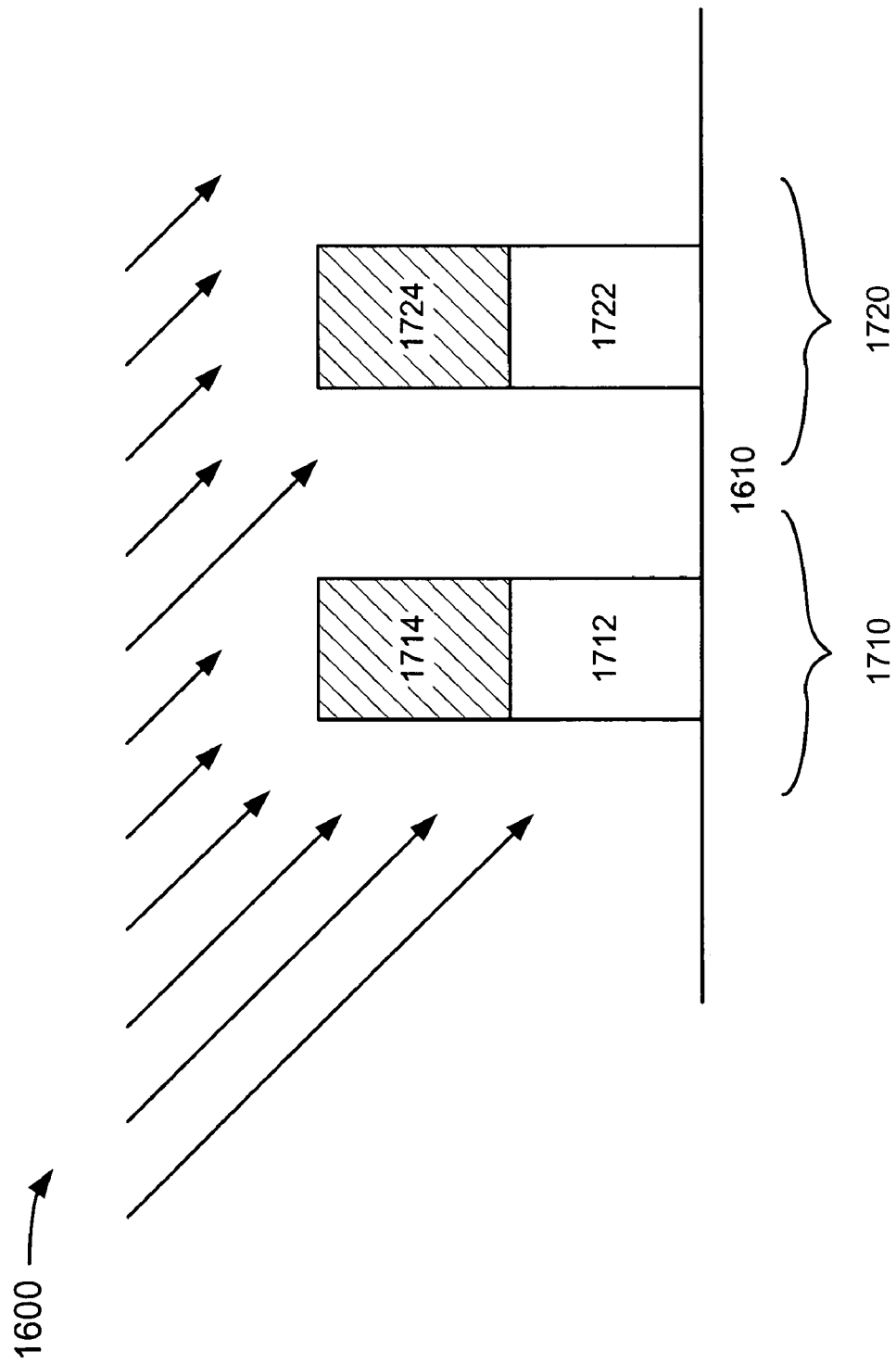

Another conventional implantation process of n-type or p-type impurities may be performed to dope fin 1712, as illustrated in FIG. 19. The particular angle used for the implantation process may be dependent upon the height of cap 1714/1724. For example, if the height of cap 1714/1724 is approximately equal to the height of fin 1712/1722, then the angle used may be less than or equal to 45 degrees. The impurities may be implanted at a dosage and an implantation energy based on the thickness of fin 1712 and the particular circuit requirements.

The implanting of the impurities does not dope fin 1722. There are several factors that aid in preventing the impurities from reaching fin 1722. For example, the presence, height, and closeness of fin structure 1710 shields or shadows fin 1722, thereby blocking the impurities from reaching fin 1722. The height of cap 1724 also helps block the impurities.

Figure 20:
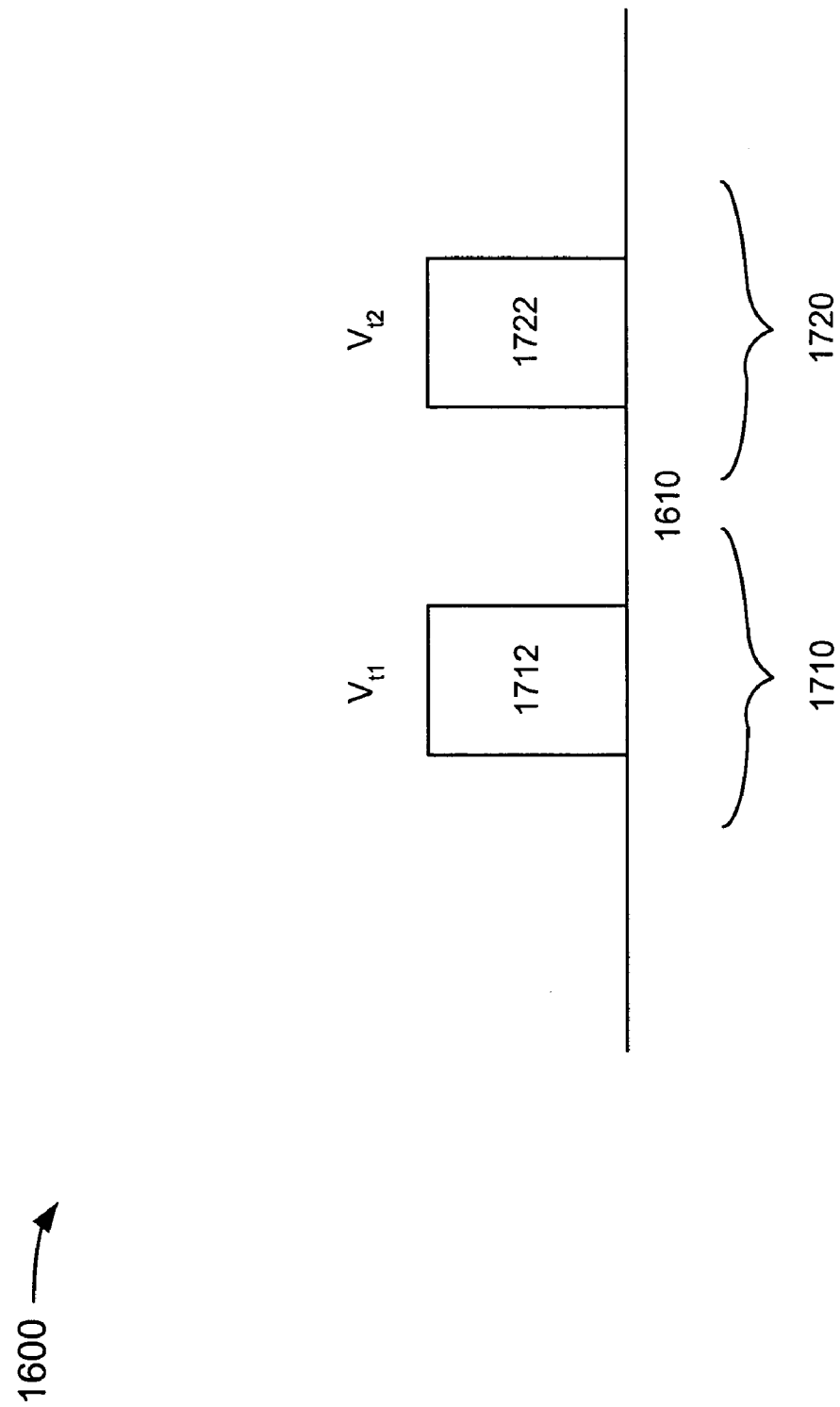

Caps 1714 and 1724 may then be removed, as illustrated in FIG. 20. The resulting fin structures 1710 and 1720 may have different threshold voltages $V_t$.

CONCLUSION

Implementations consistent with the principles of the invention perform selective channel implantation to form FinFET devices that have different threshold voltages $V_t$'s. The FinFET devices may be used to optimize circuit performance.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention.

For example, in the above descriptions, numerous specific details are set forth, such as specific materials, structures, chemicals, processes, etc., in order to provide a thorough understanding of implementations consistent with the present invention. These implementations and other implementations can be practiced, however, without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While series of acts have been described with regard to FIGS. 1 and 8, the order of the acts may be varied in other implementations consistent with the present invention. Moreover, non-dependent acts may be implemented in parallel.

With regard to the implementation described with regard to FIGS. 1-7, three or more semiconductor devices may be formed in other implementations consistent with the principles of the invention. In this case, each of the semiconductor devices may alternatively be covered and possibly doped to a different degree. The resulting semiconductor devices may have different threshold voltages.

With regard to the implementation described with regard to FIGS. 8-15, three or more semiconductor devices may be formed in other implementations consistent with the principles of the invention. In this case, polysilicon material may be selectively removed from each of the semiconductor in turn, followed by an implantation process. The resulting semiconductor devices may have different threshold voltages.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A method, comprising:
    forming at least first and second fin field effect transistor (FinFET) devices, the first and second FinFET devices each including a source, drain and fin region;
    depositing a layer of polysilicon over the first and second FinFET devices;
    selectively removing substantially all of the layer of polysilicon from over the fin region of the first FinFET device;
    performing an implantation process on the fin region of the first FinFET device subsequent to selectively removing substantially all of the layer of polysilicon from over the fin region; and
    selectively removing substantially all of the layer of polysilicon from over the fin region of the second FinFET device, subsequent to performing the implantation process, where threshold voltages associated with the first and second FinFET devices are different.

2. The method of claim 1, wherein the depositing the layer of polysilicon includes forming the polysilicon layer on the first and second FinFET devices to a thickness ranging from about 100 Å to about 1000 Å.

3. The method of claim 1, wherein selectively removing substantially all of the layer of polysilicon from over the fin region of the first FinFET device includes etching the layer of polysilicon to form a gate trench over the fin region of the first FinFET device.

4. The method of claim 3, wherein the etching the layer of polysilicon includes:
    forming a mask that covers a first portion but not a second portion of the polysilicon layer, and
    removing the second portion of the polysilicon layer.

5. The method of claim 3, wherein the performing an implantation process includes doping the fin region of the first FinFET device.

6. The method of claim 3, wherein the selectively removing substantially all of the polysilicon layer from over the fin region of the second FinFET device includes etching the polysilicon layer to form a gate trench over the fin region of the second FinFET device.

7. The method of claim 6, further comprising:
    forming first and second gates within the gate trenches of the first and second FinFET devices, respectively.

8. The method of claim 7, wherein the forming first and second gates includes:
    forming a gate dielectric on surfaces of the gate trenches of the first and second FinFET devices, and
    depositing gate electrode material to at least partially fill the gate trenches of the first and second FinFET devices.

9. The method of claim 1, further comprising:
    forming the first and second FinFET devices on a same wafer or chip.

10. The method of claim 1, wherein the at least first and second FinFET devices includes at least three semiconductor devices.

11. A method, comprising:
    forming first and second semiconductor devices, each including a semiconductor fin;
    forming a layer of polysilicon over the first and second semiconductor devices;
    removing a first portion of the layer of polysilicon to form a trench over the semiconductor fin of the first semiconductor device, wherein the trench extends through the layer of polysilicon down to the semiconductor fin; and
    implanting n-type or p-type impurities in the semiconductor fin of the first semiconductor device through the trench such that a first threshold voltage associated with the first semiconductor device is different than a second threshold voltage associated with the second semiconductor device.

12. The method of claim 11, wherein implanting n-type or p-type impurities comprises:
    implanting the n-type or p-type impurities at a dosage of about $10^{15}$ atoms/cm$^2$ to about $10^{16}$ atoms/cm$^2$ and at an implantation energy of about 10 Kev to about 50 Kev.

13. The method of claim 11, wherein the first and second semiconductor devices comprise fin field effect transistor (FinFET) devices.

14. The method of claim 11, further comprising:
    removing a second portion of the polysilicon layer to form a trench over the semiconductor fin of the second semiconductor device.

15. The method of claim 14, further comprising:
    forming first and second gates within the trenches formed over the semiconductor fins of the first and second semiconductor devices.

16. The method of claim 1, wherein the fin region has a width ranging from about 50 Å to about 1,000 Å and a height ranging from about 100 Å to about 1,000 Å.

17. The method of claim 16, wherein the source region is formed at a first end of the fin region and the drain region is formed at a second end of the fin region.

18. The method of claim 11, wherein the semiconductor fin has a width ranging from about 50 Å to about 1,000 Å and a height ranging from about 100 Å to about 1,000 Å.

* * * * *